United States Patent
Deng et al.

(10) Patent No.: US 9,712,183 B2
(45) Date of Patent: Jul. 18, 2017

(54) AXIALLY AND CENTRALLY SYMMETRIC CURRENT SOURCE ARRAY

(71) Applicant: VIA Alliance Semiconductor Co., Ltd., Shanghai (CN)

(72) Inventors: Jade Deng, Shanghai (CN); Keith Ma, Shanghai (CN)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 15/160,755

(22) Filed: May 20, 2016

(65) Prior Publication Data
US 2017/0163280 A1    Jun. 8, 2017

(30) Foreign Application Priority Data

Dec. 4, 2015 (CN) .......................... 2015 1 0885246

(51) Int. Cl.
*H03M 1/06* (2006.01)
*H03M 1/68* (2006.01)
*H03M 1/74* (2006.01)

(52) U.S. Cl.
CPC ........... *H03M 1/68* (2013.01); *H03M 1/0651* (2013.01); *H03M 1/74* (2013.01)

(58) Field of Classification Search
None
See application file for complete search history.

(56) References Cited

U.S. PATENT DOCUMENTS

| | | | | | |
|---|---|---|---|---|---|
| 3,995,304 | A | * | 11/1976 | Pease | H01L 27/0823 257/205 |
| 5,057,838 | A | * | 10/1991 | Tsuji | H03M 1/0651 341/133 |
| 5,760,725 | A | | 6/1998 | Yoshida et al. | |
| 5,949,362 | A | * | 9/1999 | Tesch | H03M 1/0651 341/144 |

(Continued)

FOREIGN PATENT DOCUMENTS

| CN | 201966893 | 9/2011 |
|---|---|---|
| CN | 102522988 | 6/2012 |

(Continued)

OTHER PUBLICATIONS

Chinese language office action dated Dec. 23, 2016, issued in application No. TW 105113806.
(Continued)

*Primary Examiner* — Howard Williams
(74) *Attorney, Agent, or Firm* — McClure, Qualey & Rodack, LLP

(57) ABSTRACT

A current source device having a current source array includes a plurality of current source units, a plurality of least significant bits, and a plurality of most significant bits. The current source units are arranged along a plurality rows and columns of a current source array. Each of the least significant bits includes a first amount of current source units is placed at the geometric center of the current source array. Each of the most significant bits includes a second amount of current source units. The second amount is the first amount multiplied by a positive integer. The two adjacent bits in the most significant bits are centrally symmetrical to the geometric center.

8 Claims, 4 Drawing Sheets

(56) References Cited

U.S. PATENT DOCUMENTS

| | | | |
|---|---|---|---|
| 6,100,833 A | 8/2000 | Park | |
| 6,710,405 B2 | 3/2004 | Zommer et al. | |
| 6,720,898 B1 | 4/2004 | Ostrem | |
| 6,954,164 B2 * | 10/2005 | Lee | H03M 1/0648 257/202 |
| 7,439,894 B2 * | 10/2008 | Peng | H03M 1/0648 257/202 |
| 8,013,770 B2 * | 9/2011 | Yang | H03M 1/0648 341/144 |
| 8,223,054 B2 | 7/2012 | Hwang | |
| 8,471,739 B2 | 6/2013 | Choi et al. | |
| 8,928,512 B2 | 1/2015 | Yuan et al. | |
| 2014/0304575 A1 | 10/2014 | Lee | |

FOREIGN PATENT DOCUMENTS

| | | |
|---|---|---|
| CN | 102638270 | 8/2012 |
| CN | 103929180 | 7/2014 |
| CN | 103959655 | 7/2014 |
| TW | 200807890 | 2/2008 |
| TW | 200807890 A | 2/2008 |

OTHER PUBLICATIONS

Chinese language office action dated Dec. 6, 2016, issued in application No. TW 105108411.

Polgreen, T.L., et al.; "Improving the ESD failure threshold of silicided n-MOS output transistors by ensuring uniform current flow;" IEEE Transactions on Electron Devices; vol. 39; No. 2; Feb. 1992; pp. 379-388.

* cited by examiner

AXIALLY AND CENTRALLY SYMMETRIC CURRENT SOURCE ARRAY

CROSS REFERENCE TO RELATED APPLICATIONS

This Application claims priority of China Patent Application No. 201510885246.6, filed on Dec. 4, 2015, the entirety of which is incorporated by reference herein.

BACKGROUND OF THE INVENTION

Field of the Invention

The disclosure relates generally to a layout placement of a current source device, and more particularly it relates to a layout placement of a current source adapted for a current-steering digital-to-analog converter.

Description of the Related Art

Arrays of equal value current sources are used to define the most significant bits in high-speed digital to analog converters (DACs). Accurate matching between these current sources, typically implemented with MOS transistors, is essential to achieve a DAC that is highly linear without being trimmed or calibrated.

The individual current sources of a DAC are mismatched for a number of reasons. Random fluctuations in threshold voltage and charge carrier mobility cause a random mismatch between the current sources. Gradients in oxide thickness, mechanical stress and resistive voltage drops in supply lines cause linear, parabolic and higher order gradients across the current source array, resulting in a nonlinear DAC transfer function.

Therefore, the layout of thermometer coded most significant bits (MSBs) for a current-steering DAC must be done with utmost care to avoid systematic errors due to linear and higher order process gradients.

BRIEF SUMMARY OF THE INVENTION

For solving above problems, the invention provides a current source device having a current source array which is axially symmetric and centrally symmetric.

In an embodiment, a current source device, having a current source array, comprises a plurality of current source units, a plurality of least significant bits, and a plurality of most significant bits. The current source units are arranged along a plurality of rows and a plurality of columns of the current source array. Each of the least significant bits comprises a first amount of current source units, and the least significant bits are placed at the geometric center of the current source array. Each of the most significant bits comprises a second amount of current source units. The second amount is the first amount multiplied by a positive integer. Two adjacent bits in the most significant bits are centrally symmetric to the geometric center.

According to an embodiment of the invention, the current source array comprises a first symmetry axis through the geometric center, each of the most significant bits is divided into two parts, and the two parts are symmetric to the first symmetry axis.

According to an embodiment of the invention, the current source array further comprises a second symmetry axis through the geometric center, wherein the second symmetry axis is orthogonal to the first symmetry axis and divides the current source array into a first region and a second region, wherein the two adjacent bits in the most significant bits are respectively placed in different the first region and the second region.

According to an embodiment of the invention, the most significant bits are divided into a plurality of odd bits and a plurality of even bits, wherein the odd bits are in the first region, and the even bits are in the second region.

According to an embodiment of the invention, each of the most significant bits is divided into a first part and a second part, wherein the first part and the second part are respectively placed in either side of the first symmetry axis.

According to an embodiment of the invention, a first odd bit of the odd bits is adjacent to a first even bit of the even bits, wherein, when the first part and the second part of the first odd bit are coupled on the first symmetry axis and placed in the first region, the first part and the second part of the first even bit are separated from the first symmetry axis and placed in the second region.

According to another embodiment of the invention, a first odd bit of the odd bits is adjacent to a first even bit of the even bits, wherein, when the first part and the second part of the first odd bit are separated from the first symmetry axis and placed in the first region, the first part and the second part of the first even bit are coupled on the first axis and placed in the second region.

According to an embodiment of the invention, the current source array comprises N bits of thermometer codes and M bits of binary codes, wherein the positive integer is $(2^M-1)$, the amount of least significant bits is $(2^M-1)$, the amount of most significant bits is $(2^N-1)$, wherein the least significant bit and a plurality of dummy current source units form a least significant bit array placed in the geometric center, wherein two adjacent bits in the most significant bits are centrally symmetric to the least significant bit array.

According to an embodiment of the invention, the first symmetric axis stretches along the direction of the rows, and the second symmetric axis stretches along the direction of the columns.

According to another embodiment of the invention, the first symmetry axis stretches along the direction of the columns, and the second symmetry axis stretches along the direction of the rows.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
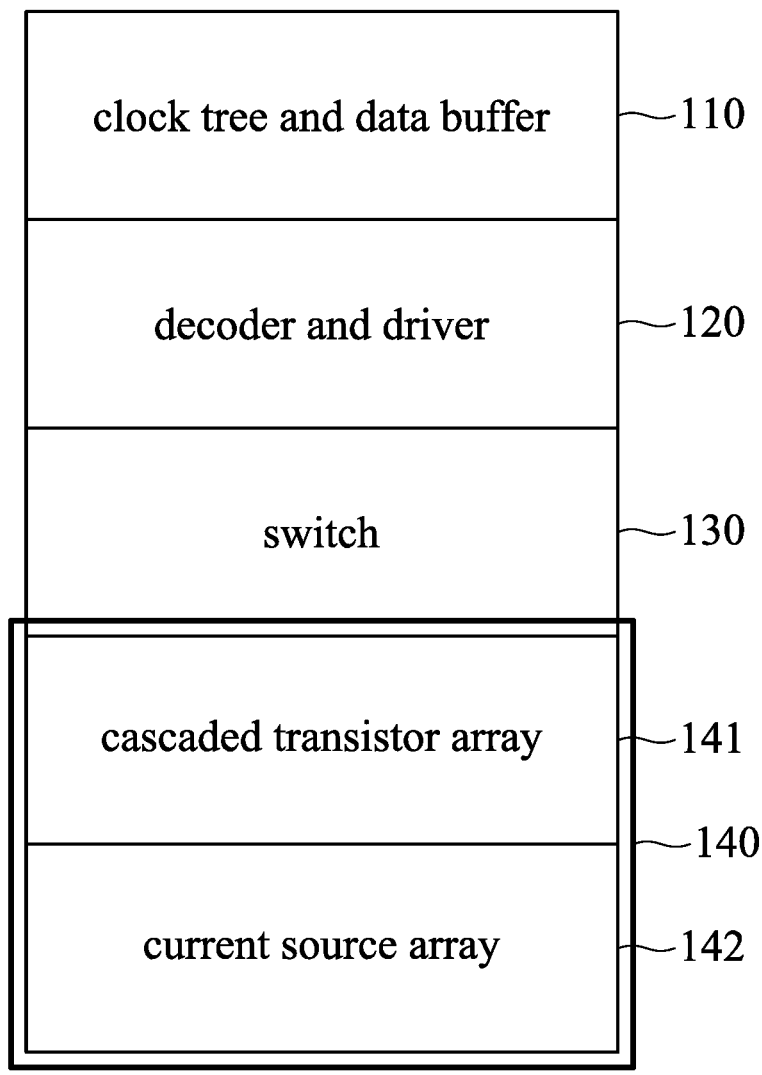
FIG. 1 is a floor plan of a current-steering digital-to-analog converter in accordance with an embodiment of the invention.

FIG. 1 is a floor plan of a current-steering digital-to-analog converter in accordance with an embodiment of the invention. As shown in FIG. 1, the current-steering digital-to-analog converter 100 includes the clock tree and data buffer 110, the decoder and driver 120, the switch 130, and the cascode current source array 140. The clock tree and data buffer 110 is configured to synchronize the input digital data with the clock and to improve the driving capability of the input digital data.

The decoder and driver 120 is configured to decode the input digital data to be the decoded data and to drive the switch 130 according to the decoded data. According to an embodiment of the invention, the decoder and driver 120 is configured to convert part of or all of the input digital data from being in binary code into being in thermometer code, and then to drive the switch 130.

The switch 130 controls the direction of the current according to the control of the decoder and driver 120. The cascode current source array 140 includes the cascaded transistor array 141 and the current source array 142, in which a cascode current source unit of the cascode current source array 140 is constructed by a cascaded transistor of the cascaded transistor array 141 integrated with a current source unit of the current source array 142.

According to an embodiment of the invention, the current-steering digital-to-analog converter 100 is an X-bit digital-to-analog converter, and the cascode current source array 140 includes $2^X$ cascode current source units. In other words, the cascaded transistor array 141 includes $2^X$ cascaded transistors, the current source array 142 includes $2^X$ current source units, and the switch 130 includes $(2^{X+1})$ switch units. A 10-bit digital-to-analog converter is illustrated herein to describe the layout of the current source array 142 in detail.

Figure 2:
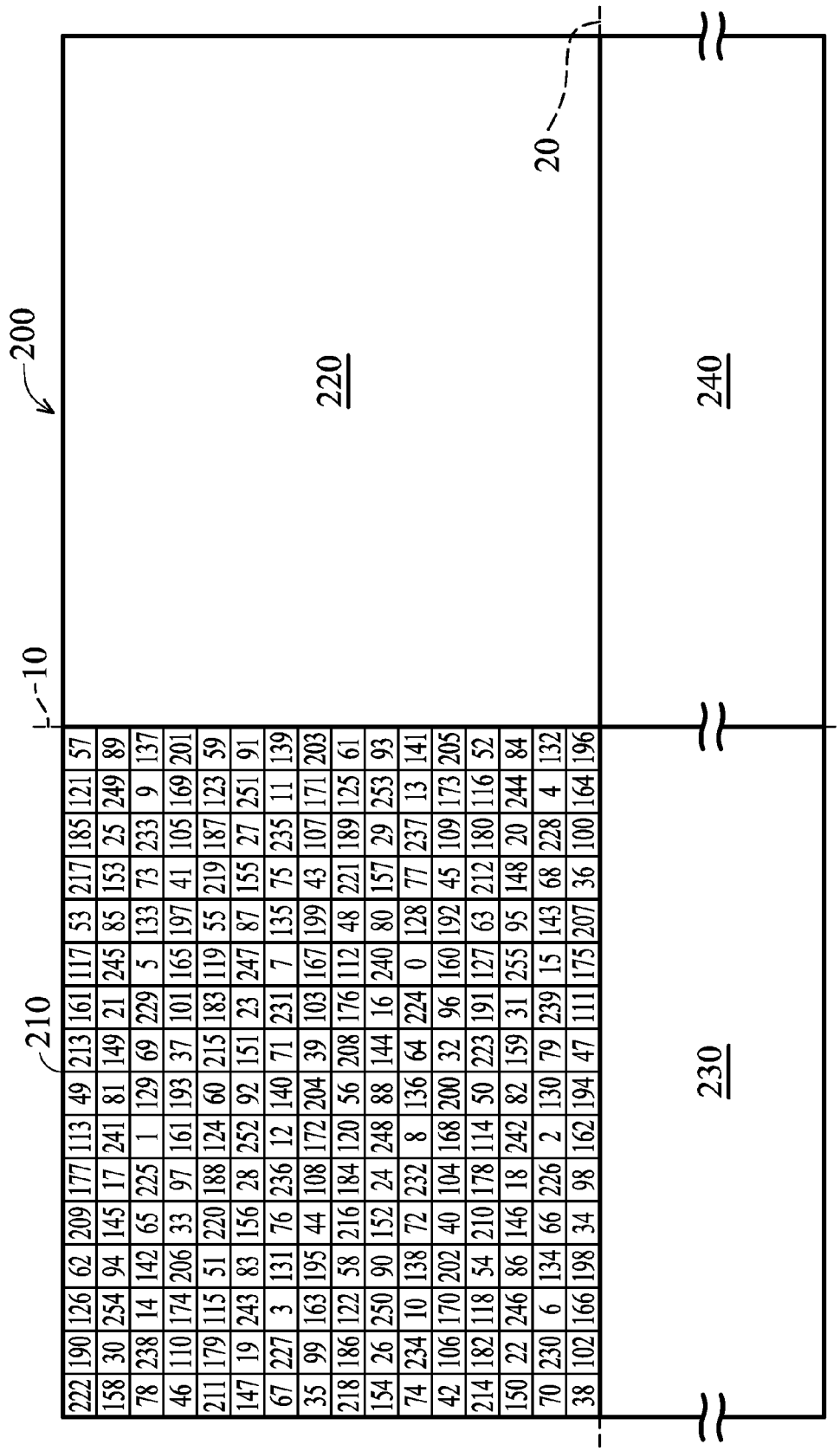
FIG. 2 is a circuit layout diagram of a current source array in accordance with an embodiment of the invention.

FIG. 2 is a circuit layout diagram of a current source array in accordance with an embodiment of the invention. As shown in FIG. 2, the current source array 200 is divided into the first part 210, the second part 220, the third part 230, and the fourth part 240 by the first axis 10 and the second axis 20. The first part 210 and the second part 220 are respectively axisymmetric to the third part 230 and the fourth part 240 relative to the second axis 20. The first part 210 and the third part 230 are respectively axisymmetric to the second part 220 and the fourth part 240 relative to the first axis 10. According to an embodiment of the invention, the first axis 10 and the second axis 20 are orthogonal.

According to an embodiment of the invention, the first part 210 is divided into 256 current source units which are represented by numbers from 0 to 255. A number of 0 means that the current source unit is the least significant bit (LSB), and a number of 255 means that the current source unit is the most significant bit (MSB). Since the first part 210, the second part 220, the third part 230, and the fourth part 240 are axially symmetric to the first axis 10 and the second axis 20, the current source units with a number of 0 and a number of 255 should be found in the second part 220, the third part 230, and the fourth part 240 as well, in which the current source units with a number of 0 and those with a number of 255 in the first part 210, the second part 220, the third part 230, and the fourth part 240 are individually symmetric, related to the first axis 10 and the second axis 20.

In other words, the current source unit from the least significant bit to the most significant bit are equally divided into four parts which are separated into the first part 210, the second part 220, the third part 230, and the fourth part 240 in a way that is axially symmetric to the first axis 10 and the second axis 20. According to an embodiment of the invention, the current source array 200 is the current source array of the 10-bit digital-to-analog converter, in which the current source array 200 is divided into four parts, each of which includes 256 current source units. That is, the current source array 200 includes 1024 current source units. According to an embodiment of the invention, the least significant bit has at least one current source unit, and the number of current source units constructing the least significant bit may be determined by the designer.

As shown in FIG. 2, since each of the bits, from the least significant bit to the most significant bit, is divided into 4 parts equally and separated among the first part 210, the second part 220, the third part 230, and the fourth part 240. The least significant bit is illustrated herein. Since the current source unit with number of 0, which is separated among the first part 210, the second part 220, the third part 230, and the fourth part 240, should be coupled together by the wire, the complexity of routing the wire could be increased. Since the wire routing is too complex to occupy a large area, such that a substantial parasitic capacitance is produced. The operation speed of the circuit should be lowered.

Figure 3:
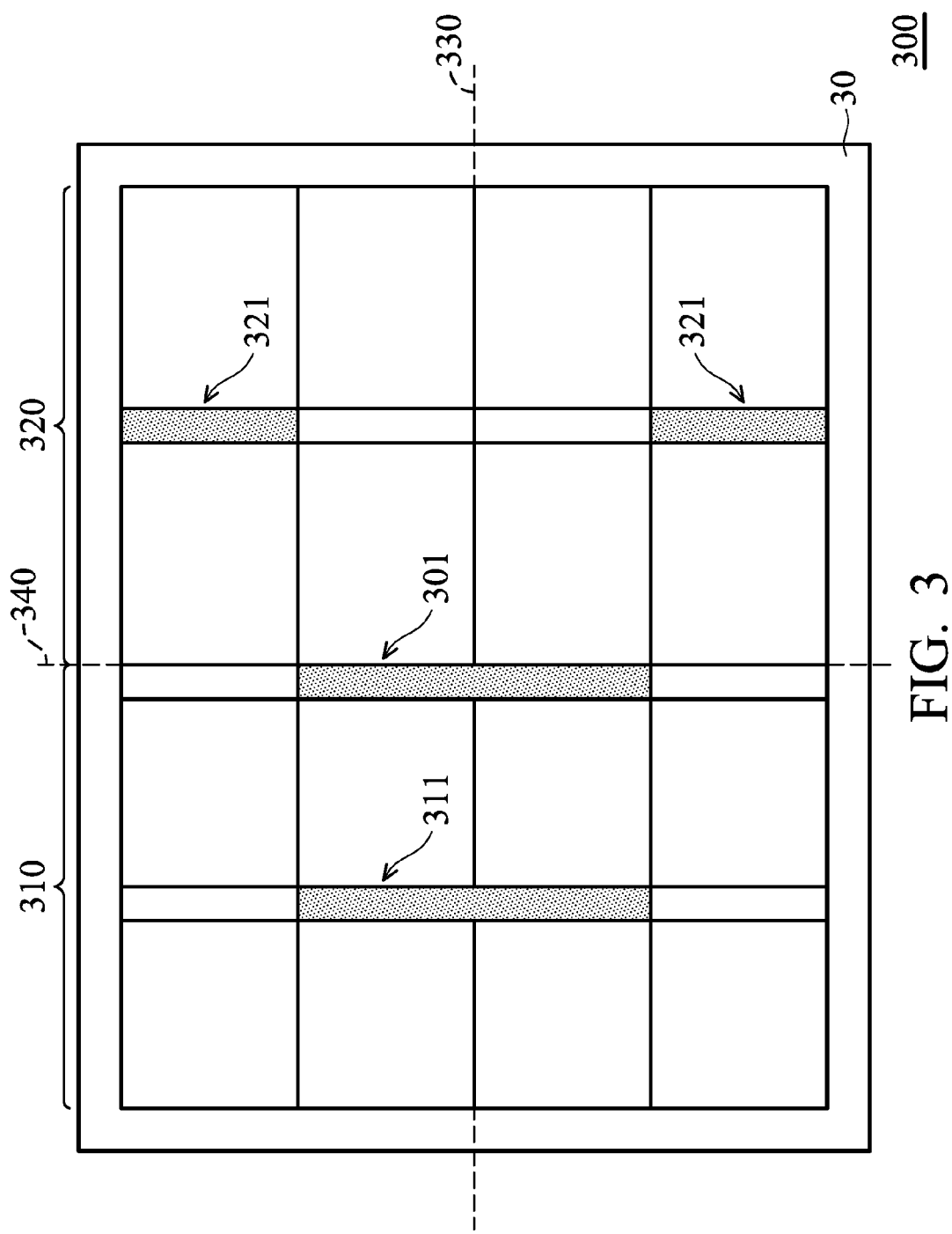
FIG. 3 is a circuit layout diagram of a current source array in accordance with another embodiment of the invention.

FIG. 3 is a circuit layout diagram of a current source array in accordance with another embodiment of the invention. As shown in FIG. 3, the current source array 300 includes the dummy cells 30, a plurality of the least significant bits 301, the first region 310, the first most significant bit 311, the second region 320, and the second most significant bit 321, in which the second symmetry axis 340 divides the current source array 300 into the first region 310 and the second region 320. The current source units are arranged in a plurality of columns and a plurality of rows of the current source array 300, in which the rows are horizontal and the columns are vertical. The first symmetry axis 330 is along the direction of the rows, and the second symmetry axis 340 is along the direction of the columns.

According to an embodiment of the invention, the outer layer of the current source array 300 is surrounded by the dummy cells 30 for reducing the influence of the stress caused by the gradient in the poly silicon density. According to another embodiment of the invention, the dummy cells 30 are not necessary employed in the current source array 300. According to an embodiment of the invention, the first symmetry axis 330 and the second symmetry axis 340 may be randomly rotated based on any one of the geometric centers of the current source array 300, in which the first symmetry axis 330 and the second symmetry axis 340 are orthogonal to each other.

According to an embodiment of the invention, the least significant bits 301 are placed near the geometric center of the current source array 300, and the least significant bits 301 are symmetric to the first symmetry axis 330. According to an embodiment of the invention, the least significant bits 301 may be placed in either the first region 310 or the second region 320. According to other embodiments of the invention, when the least significant bits 301 are placed at the geometric center of the current source array 300, the least significant bits 301 and the second symmetry axis 340 are overlapped. In addition, the dummy cells are employed, so that there are an identical amount of current source units in the first region 310 and the second region 320.

According to an embodiment of the invention, the even bits of the most significant bits are placed in the first region 310, and the odd bits of the most significant bits are placed in the second region 320, in which the least significant bits 301 belong to the even bits and are also placed in the first region 310. According to another embodiment of the invention, the even bits of the most significant bits are placed in the second region 320, the odd bits of the most significant bits are placed in the first region 310, in which the least significant bits 301 belong to the even bits and are also placed in the second region 320. According to other embodiments of the invention, the least significant bits 301 do not belong to the first region 310 and the second region 320, and the dummy cells are employed to make the amount of odd bits equal to that of the even bits.

According to an embodiment of the invention, the first most significant bit 311 and the second most significant bit 321 are two adjacent bits. The first most significant bit 311 and the second most significant bit 321 are individually symmetric to the first symmetry axis 330. In addition, the first most significant bit 311 and the second most significant bit 321 are centrally symmetric to the geometric center of the current source array 300. According to an embodiment of the invention, the first significant bit 311 and the second most significant bit 321 respectively belong to different odd bits and even bits.

In order to simplify the illustration, a 10-bit digital-to-analog converter is illustrated in the following description, but not limited thereto, for explaining in detail, in which the 10 bits includes 6 bits of thermometer codes for controlling the most significant bits and 4 bits of binary codes for controlling the least significant bits.

Figure 4:
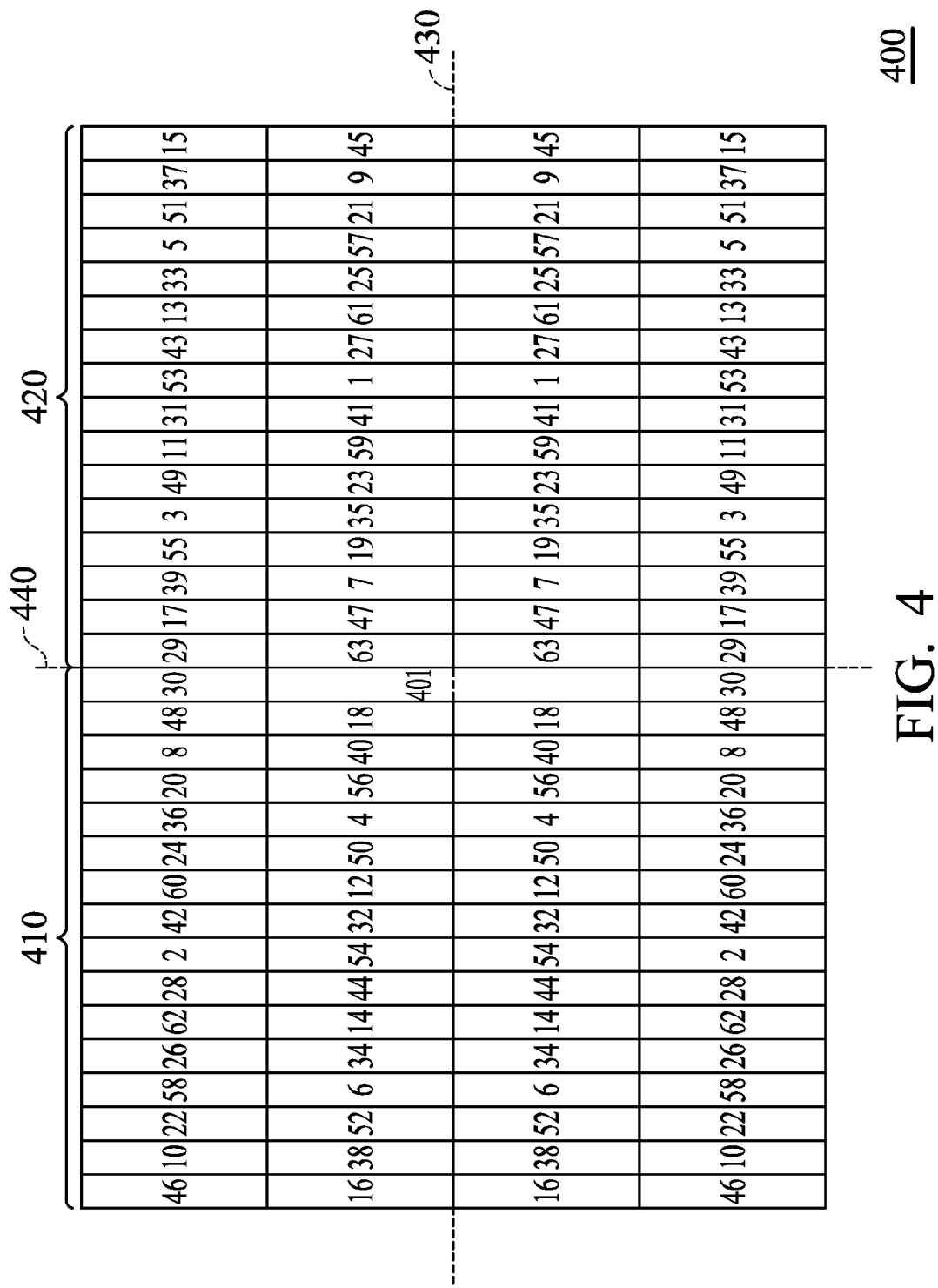
FIG. 4 is a circuit layout diagram of a current source array of a 10-bit digital-to-analog converter in accordance with an embodiment of the invention.

FIG. 4 is a circuit layout diagram of a current source array of a 10-bit digital-to-analog converter in accordance with an embodiment of the invention. According to the embodiments of the invention, the digital-to-analog converter includes N-bit of thermometer codes and M-bit of binary codes, so that the digital-to-analog converter includes ($2^M$-1) least significant bits and ($2^N$-1) most significant bits.

According to an embodiment of the invention, the 10-bit digital-to-analog converter includes 6 bits of the thermometer codes and 4 bits of the binary codes, in which the 6-bit thermometer codes are configured to control the most significant bits and the 4-bit binary codes are configured to the least significant bits. According to an embodiment of the invention, the least significant bit is constructed by a current source unit, such that the least significant bits 401 in FIG. 4 includes 15 current source units and 1 dummy cell controlled by the 4-bit binary codes. That is, the least significant bits 401 include 16 current source units, in which one of the current source units is a dummy cell.

Since 6-bit thermometer codes are configured to control the most significant bits, the current source array 400 includes ($2^6$-=63) most significant bits, in which each of the most significant bits is represented by a number between 1 and 63. In addition, each of the most significant bits includes 16 current source units and occupies the same layout area as the least significant bits 401. In other words, the current source array 400 includes (64*16=1024) current source units in total, in which a dummy cell is included in the 1024 current source units.

As shown in FIG. 4, the second symmetry axis 440 divides the current source array 400 into the first region 410 and the second region 420. According to an embodiment of the invention, the least significant bits 401 are placed near the geometric center of the current source array 400, and the least significant bits 401 belong to the first region 410. According to another embodiment of the invention, when the least significant bits 401 are placed at the geometric center, the least significant bits 401 are placed on the second symmetry axis 440. The dummy cell may be employed, so that the first region 310 and the second region 320 have the same amount of current source units.

The most significant bits with numbers 45 and 46 are illustrated herein. Since a number of 45 and a number of 46 respectively represent the $45^{th}$ most significant bit and the $46^{th}$ most significant bit, the most significant bits with numbers 45 and 46 are two adjacent bits in the most significant bits. As shown in FIG. 4, the most significant bits with numbers 45 and 46 are both divided into 2 parts and individually symmetric to the first symmetry axis 430. In addition, the most significant bits with numbers 45 and 46 are centrally symmetric to the geometric center of the current source array 400 which is the intersection of the first symmetry axis 430 and the second symmetry axis 440.

According to an embodiment of the invention, except for the least significant bits 401, each of the most significant bits in the current source array 400 is divided into 2 parts at most. Comparing to the current source array 200 in FIG. 2 which is divided into 4 parts, the routing complexity and the routing area of the current source array 400 are greatly reduced, so that the parasitic capacitance due to the routing area is reduced. Therefore, the current source array 400 is able to operate in a higher operation speed.

In addition, two adjacent bits in the most significant bits are centrally symmetric (i.e., two adjacent odd bit and even bit are centrally symmetric) and each bit is axially symmetric, such that the process gradients is reduced and so is the influence caused by the gradient in the poly silicon density. In addition, the influence of the thermal gradient may be lowered, such that the performance of the digital-to-analog converter is improved.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A current source device, having a current source array, comprising:
   a plurality of current source units, arranged along a plurality of rows and a plurality of columns of the current source array;
   a plurality of least significant bits, wherein each of the least significant bits comprises a first amount of current source units, and the least significant bits are placed at a geometric center of the current source array; and
   a plurality of most significant bits, wherein each of the most significant bits comprises a second amount of current source units, wherein the second amount is the first amount multiplied by a positive integer, wherein two adjacent bits in the most significant bits are centrally symmetric to the geometric center;
   wherein the current source array comprises a first symmetry axis through the geometric center, each of the most significant bits is divided into two parts, and the two parts are symmetric to the first symmetry axis,
   wherein the current source array further comprises a second symmetry axis through the geometric center, wherein the second symmetry axis is orthogonal to the first symmetry axis and divides the current source array into a first region and a second region, wherein one of the two adjacent bits in the most significant bits is placed in one of the first region and the second region, and the other of the two adjacent bits in the most significant bits is placed in the other of the first region and the second region, wherein every most significant bit is configured with 16 current source units, a most significant bit and next most significant bit are each divided into two parts, and the two parts of a most significant bit are placed in the first region, symmetrically disposed across the first symmetry axis, and the two parts of next most significant bit are placed in the second region, symmetrically disposed across the first symmetry axis, and wherein the least significant bits are enclosed by the most significant bits.

2. The current source device of claim 1, wherein the most significant bits are divided into a plurality of odd bits and a plurality of even bits, wherein the odd bits are in the first region, and the even bits are in the second region.

3. The current source device of claim 2, wherein each of the most significant bits is divided into a first part and a second part, wherein the first part and the second part are respectively placed in either side of the first symmetry axis.

4. The current source device of claim 3, wherein a second odd bit of the odd bits is adjacent to a second even bit of the even bits, wherein, when the first part and the second part of the second odd bit are connected together at the first symmetry axis and placed in the first region, the first part and the second part of the second even bit are separated from the first symmetry axis and placed in the second region.

5. The current source device of claim 1, wherein the current source array comprises N bits of thermometer codes and M bits of binary codes, wherein the positive integer is $(2^M)$, the amount of least significant bits is M, the amount of most significant bits is $(2^N-1)$, wherein the least significant bit and a plurality of dummy current source units form a least significant bit array placed in the geometric center, wherein two adjacent bits in the most significant bits are centrally symmetric to the least significant bit array.

6. The current source device of claim 1, wherein the first symmetric axis stretches along a direction of the rows, and the second symmetric axis stretches along a direction of the columns.

7. The current source device of claim 1, wherein the first symmetry axis stretches along a direction of the columns, and the second symmetric axis stretches along a direction of the rows.

8. The current source device of claim 1, wherein only two of the most significant bits are arranged along a direction of the second symmetry axis.

* * * * *